United States Patent [19]

Pipkorn

[11] Patent Number: 4,629,976
[45] Date of Patent: Dec. 16, 1986

[54] METHOD AND CIRCUIT FOR EVALUATING AN ANALOG VOLTAGE

[75] Inventor: Mark G. Pipkorn, Minneapolis, Minn.

[73] Assignee: NCR Corporation, Dayton, Ohio

[21] Appl. No.: 706,696

[22] Filed: Feb. 28, 1985

[51] Int. Cl.$^4$ ............................................. G01R 15/12
[52] U.S. Cl. .................................. 324/73 PC; 324/51; 324/133
[58] Field of Search ................. 324/73 PC, 73 R, 51, 324/133; 371/66, 67; 340/657

[56] References Cited

U.S. PATENT DOCUMENTS

| | | | |
|---|---|---|---|
| 3,746,981 | 7/1973 | Stone | 324/73 R |
| 4,208,627 | 6/1980 | Ebert, Jr. | 324/133 X |
| 4,488,110 | 12/1984 | Shirey et al. | 324/133 |
| 4,578,637 | 3/1986 | Allen et al. | 324/73 PC |

*Primary Examiner*—Stanley T. Krawczewicz
*Attorney, Agent, or Firm*—Wilbert Hawk, Jr.; Edward Dugas; Richard W. Lavin

[57] ABSTRACT

A method and circuit for detecting a fault condition in a voltage distribution bus which includes sensing a first voltage drop across a test resistor wired in series with the bus, sensing a second voltage drop across a second resistor wired in series with the bus and comparing the first and second voltage drops to detect a fault condition in the voltage supply connected to the bus.

7 Claims, 3 Drawing Figures

METHOD AND CIRCUIT FOR EVALUATING AN ANALOG VOLTAGE

BACKGROUND OF THE INVENTION

The present invention is directed to data processing systems and more particularly to a diagnostic method and circuit for evaluating fault conditions in bus voltages within a data processing system.

Data processing systems provide a diagnostic routine for detecting various fault conditions in operating parameters of the system. One type of parameter which is especially important to the operation of the system is the bus voltages appearing on the input connection to various printed circuit boards on which are located the processing elements that comprise the data processing system. In monitoring such bus voltages, a zero voltage reading may indicate an actual zero bus voltage or the presence of an open condition in the circuit. Presently available measuring devices such as voltmeters and ohmeters cannot accurately predict the cause of such voltage readings by themselves without the addition of a plurality of measuring devices acting together which would require the addition of a plurality of sensing lines to the system.

It is therefore a principal object of this invention to provide a method and circuit for automatically determining the status of an input connection.

It is a further object of this invention to provide a method and circuit for automatically detecting a fault condition in a data processing system which pertains to voltages on a voltage distribution bus.

It is another object of this invention to provide a method and circuit for automatically determining a fault condition without requiring the addition of a plurality of diagnostic sensing lines in the system.

SUMMARY OF THE INVENTION

In order to carry out these objectives, there is provided a method for detecting a fault in a voltage distribution bus which is normally supplied with a line voltage level by a voltage supply and which is connected to an electrical element utilizing the line voltage comprising the steps of; connecting a test circuit to the voltage distribution bus; supplying a current to the test circuit; sensing a first voltage level representing the voltage drop of the test circuit; adding a first resistor in series with the test circuit; sensing a second voltage level representing the voltage drop across the first resistor; adding a second resistor in series with the test circuit and removing the first resistor from the circuit; sensing a third voltage level representing the voltage drop of the circuit including the second resistor; comparing the second voltage level with the third voltage level; and generating a first signal actuating an alarm indicating a failure of the voltage supply when the second voltage drop is greater than the third voltage drop. There is also provided a test circuit for detecting a fault condition in a voltage distribution bus which is normally supplied with a line voltage level by a voltage supply and which is connected to an electrical element utilizing the line voltage comprising a source of current; a first resistor connected in series with the communication bus; a voltage sensing means connected across the first resistor for detecting the voltage drop across the first resistor; a second resistor connected across the voltage sensing means; first switch means connected between the first resistor and the voltage sensing means and operable to remove the first resistor from a connection to the voltage sensing means; second switch means connected between the second resistor and the voltage sensing means and operable to remove the second resistor from a connection to the voltage sensing means; third switch means connected between the source of current and the test circuit and operable to connect the source of current to the test circuit; and processor means connected to said first, second and third switch means and said voltage sensing means for sequentially operating said first, second and third switch means enabling the voltage sensing means to sense a first and second voltage drop across the first and second resistors, respectively, whereby the processor means will operate an alarm indicating a first fault condition in the voltage supply when the first voltage drop is greater than the second voltage drop.

BRIEF DESCRIPTION OF THE DRAWINGS

The foregoing and various other objects, advantages and meritorious features of the present invention will be apparent from the following detailed description and appended claims, when read in conjunction with the drawings, wherein like numerals identify corresponding elements.

DESCRIPTION OF A PREFERRED EMBODIMENT

Figure 1:
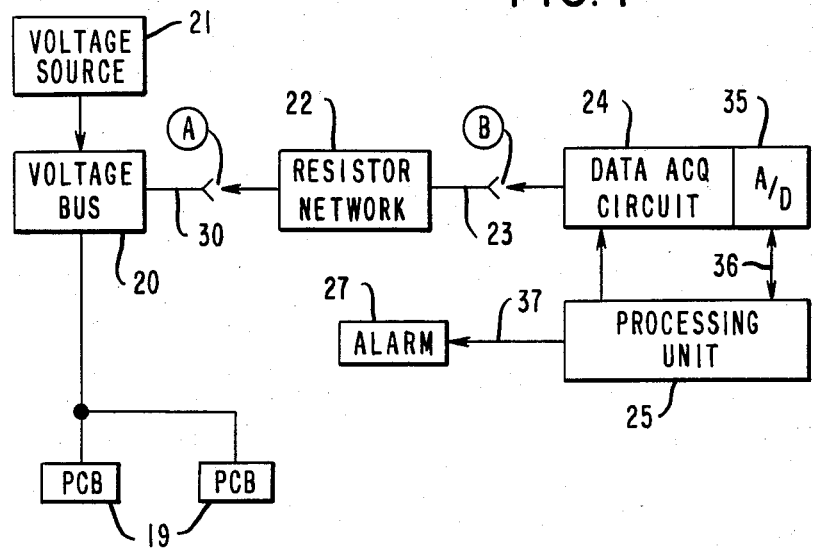
FIG. 1 is a block diagram of the sensing system which includes the circuit of the present invention.

Referring now to FIG. 1, there is shown a block diagram of a portion of a data processing system which includes the circuit of the present invention. A voltage distribution bus 20 is connected to a voltage source 21 which supplies voltage to the bus 20 for operating elements in the data processing system such as printed circuit boards 19 connected to the bus 20. Also connected to the bus 20 over line 30 is a resistor network 22 which is connected over bus 23 to a data acquisition circuit 24. The circuit 24 will monitor the voltage level appearing on the bus 20 and when such level falls to zero, a processing unit 25 of the data processing system will determine the nature of the cause for such voltage reading. The cause of such reading may include a failure of, the voltage source 21, the distribution bus 20 or the presence of an open or short circuit at point A or point B in the circuit. The resistor network 22 is designed to prescale the reading of the voltages appearing on the bus 20 to a range of plus or minus one volt when the bus voltages appearing on the bus 20 are at the required bus voltage level, e.g. plus twelve volts etc.

Figure 2:
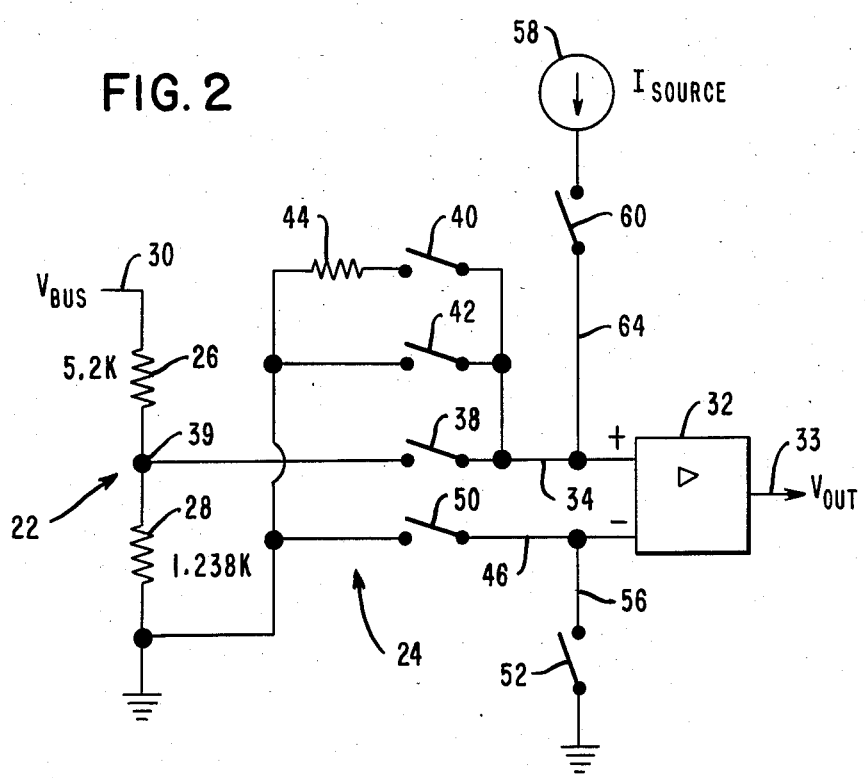
FIG. 2 is a circuit diagram of the present invention.

Referring now to FIG. 2, there is shown a schematic diagram of the resistor network 22 and the data acquisition circuit 24 of the present invention. The resistor network 22 includes the resistors 26 and 28 which are wired in series over line 30 with the voltage bus 20. The resistor 28 is connected to a remote ground or ground bus. The acquisition circuit 24 includes a differential amplifier 32 whose positive or non-inverting input is connected over line 34 and through switch 38 to a node 39 which is located intermediate the resistors 26 and 28. The negative or inverting input of the amplifier 32 is connected over line 46 and through the switch 50 to the other side of the resistor 28.

The acquision circuit 24 further includes a parallel network including switches 40 and 42 and a 1K test resistor 44 which are wired across the input lines 34 and 46 of the amplifier 32. The value of the resistor 44 must equal the total resistance of the parallel combination of the resistors 26 and 28. The amplifier 32 will normally measure the voltage drop across the resistor 28 when switches 38 and 50 are closed. The output line 33 of the amplifier 32 is connected to a A/D converter 35 whose output signal is connected over line 36 (FIG. 1) to the processing unit 25 which in turn is connected over line 37 to any type of alarm device 27 which may take the form of generating a flag or the display of an alarm condition on a CRT screen. The switch 50 is normally closed during the operation of the data acquision circuit 24. The circuit 24 further includes a constant current source 58, and switches 52 and 60 for controlling the operation of the acquisition circuit in a manner to be discribed more fully hereafter. As previously described, if the output voltage signal $V_{out}$ of the amplifier 32 indicates the voltage on the bus 20 is zero, it is not known whether the reading is a result of a failure in the voltage source 21 or the presence of an open or short circuit. The present invention provides a method for detecting the cause of such a voltage reading and the setting of an alarm upon the detection of such a condition if the condition is required to be reported. The switches in the circuit of FIG. 2 may comprise transistors or other type of mechanical and electronic switches which can be electrically operated.

Figure 3:
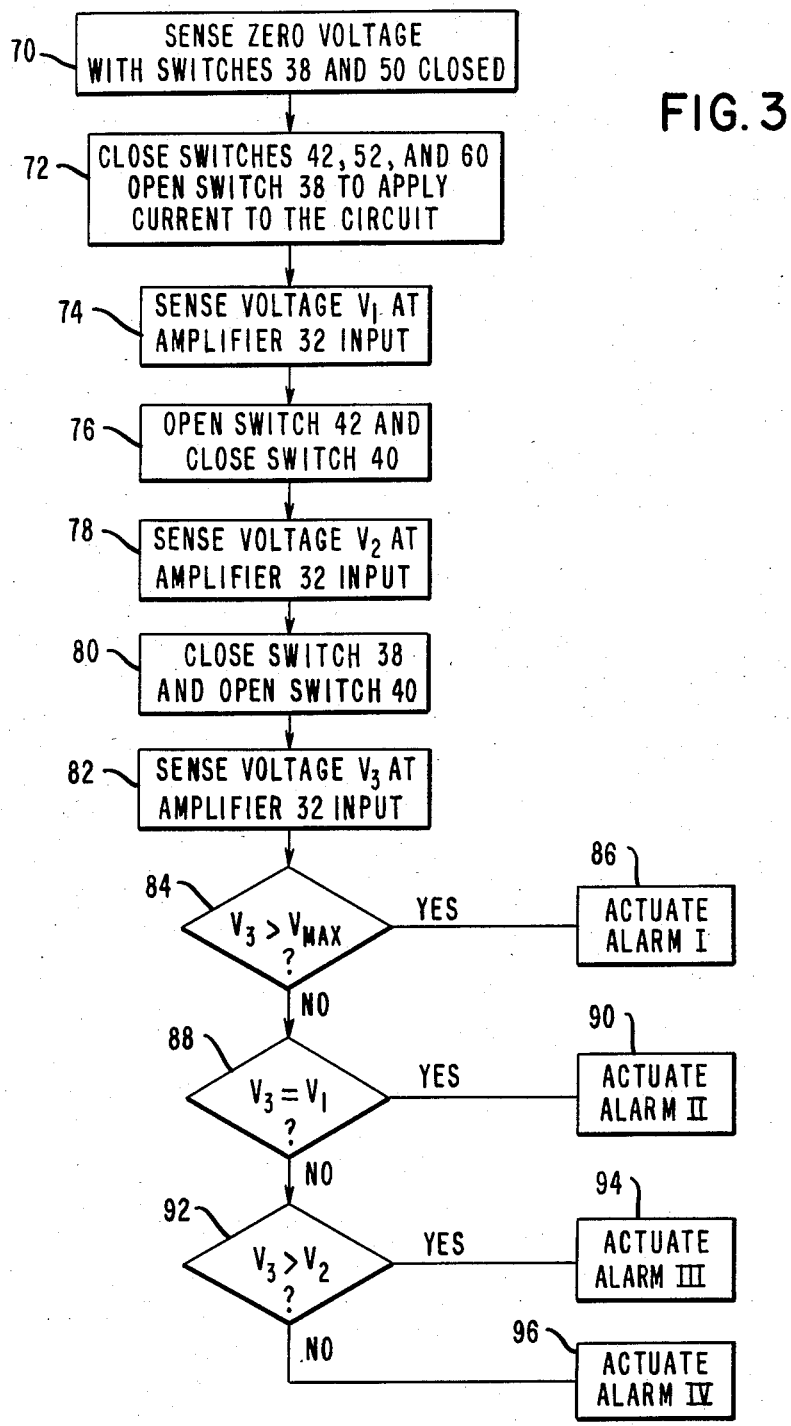
FIG. 3 is a flow chart of the method for detecting the various fault conditions of a voltage distribution bus.

Referring now to FIG. 3, there is shown a flow chart of the operation of the data acquisition circuit 24 which may, in the present embodiment, comprise a routine performed by the processing unit 25. In monitoring the voltage drop across the resistor 28 with switches 38 and 50 closed, the processing unit will, upon detecting (block 70) a zero voltage level on the bus 20, close (block 72) switches 60, 42, and 52 and open switch 38 allowing one milliamp of current to flow from a constant current source 58 (FIG. 2) through the closed switches to ground enabling the amplifier 32 to sense (block 74) a voltage drop $V_1$ across the circuit which includes the inherent resistance of the circuit due to the length of lines 34 and 46 and the resistor network 22 togethe with the resistance of the switches in the circuit. The processing unit 25 will then open switch 42 and close switch 40 (block 76) allowing the amplifier 32 to sense (block 78) a voltage drop $V_2$ across the circuit which includes the resistor 44. The processing unit will then open switch 40 and close switch 38 (block 80) allowing the amplifier 32 to sense (block 82) a voltage drop $V_3$ across the circuit which includes the resistor 28. The voltage drop $V_3$ is then compared with a voltage drop $V_{max}$ (block 84) where $V_{max}$ is the maximum voltage that can be sensed by the amplifier 32. If the voltage drop $V_3$ is greater than $V_{max}$, then there is a break at point B (FIG. 1) which may be the result of an open circuit in one of the lines in bus 23. This condition results in the generation of a signal which activates a first alarm condition (block 86) notifying the operator of the existence of such a fault condition. If $V_3$ is less than $V_{max}$, the voltage drops $V_1$ and $V_3$ are compared by the processing unit 25. If the voltage drop $V_1$ is equal to $V_3$ (block 88) indicating a short circuit in the bus 23, a signal is generated to activate a second alarm (block 90). If the voltage drop $V_3$ is not equal to $V_1$, the processing unit 25 will then compare (block 92) the voltage drop $V_3$ with $V_2$. If $V_3$ is greater than $V_2$ indicating an open circuit at point A (FIG. 1) in the circuit, a third alarm is activated (block 94). If $V_2$ is greater than $V_3$ indicating the bus voltage level supplied by the voltage source 21 (FIG. 1) is zero, a fourth alarm 96 is activated.

It will thus be seen that with this method and apparatus, various fault conditions of a voltage bus can be automatically determined and an alarm activated which notifies the operator of the presence of such a condition.

While the principles of the invention have now been made clear in an illustrated embodiment, it will be obvious to those skilled in the art that many modifications of structure, arrangements, elements and components can be made which are particularly adapted for specific environments and operating requirements without departing from those principles. The appended claims are therefore intended to cover and embrace any such modification, within the limits only of the true spirit and scope of the invention.

I claim:

1. A method for detecting a fault in a voltage distribution bus which is normally supplied with a line voltage level by a voltage supply and which is connected to an electrical element utilizing the line voltage comprising the steps of;

connecting a test circuit to the voltage distribution bus;

supplying a current to the test circuit;

sensing a first voltage level representing the voltage drop of the test circuit;

adding a first resistor in series with the test circuit;

sensing a second voltage level representing the voltage drop across the test circuit and first resistor;

adding a second resistor in series with the test circuit and removing the first resistor from the circuit;

sensing a third voltage level representing the voltage drop of the circuit including the second resistor;

comparing the second voltage level with the third voltage level; and generating a first signal actuating an alarm indicating a failure of the voltage supply when the second voltage drop is greater than the third voltage drop.

2. The method of claim 1 which further includes the steps of:

comparing the first and third voltage drops; and generating a second signal actuating an alarm indicating a short circuit in the test circuit when the first voltage drop is equal to the third voltage drop.

3. The method of claim 1 which further includes the steps of:

comparing the second and third voltage drops; and generating a third signal actuating an alarm indicating an open circuit in the circuit connection to the bus when the third voltage drop is greater than the second voltage drop.

4. A test circuit for detecting a fault condition in a voltage distribution bus which is normally supplied with a line voltage level by a voltage supply and which is connected to an electrical element utilizing the line voltage comprising:

a source of current;

a first resistor connected in series with the communication bus;

a voltage sensing means connected across the first resistor for detecting the voltage drop across the first resistor;

a second resistor connected across the voltage sensing means;

first switch means connected between the first resistor and the voltage sensing means and operable to remove the first resistor from a connection to the voltage sensing means;

second switch means connected between the second resistor and the voltage sensing means and operable to remove the second resistor from a connection to the voltage sensing means;

third switch means connected between the source of current and the test circuit and operable to connect the source of current to the test circuit;

and processor means connected to said first, second and third switch means and said voltage sensing means for sequentially operating said first, second and third switch means enabling the voltage sensing means to sense a first and second voltage drop across the first and second resistors, respectively, whereby the processor means will operate an alarm indicating a first fault condition in the voltage supply when the first voltage drop is greater than the second voltage drop.

5. The test circuit of claim 4 in which the first fault condition indicates a zero voltage level outputted by the voltage supply.

6. The test circuit of claim 4 includes a fourth switch means wired in parallel with the second resistor means and operable by the processor means to remove the second resistor means from the circuit when in a closed position whereby upon the closing of said fourth switch means and the opening of said first, second and third switch means, said voltage sensing means will sense a third voltage drop across the circuit whereby the processor means with operate an alarm indicating a second fault condition representing a short circuit in the test circuit when said second voltage drop is equal to the third voltage drop.

7. The test circuit of claim 5 in which the processor means operates an alarm indicating a third fault condition representing an open circuit in the voltage bus when the second voltage drop is greater than the first voltage drop.

* * * * *